United States Patent
Aka et al.

[11] Patent Number: 6,083,319
[45] Date of Patent: Jul. 4, 2000

[54] NON-LINEAR CRYSTALS AND THEIR APPLICATIONS

[75] Inventors: Gerard Aka, les Lilas; Laurence Bloch, Grenoble; Jean Godard, Palaiseau; Andree Kahn-Harari, Paris; Francois Salin, Villabe; Daniel Vivien, Garches, all of France

[73] Assignee: Crismatec, Saint-Pierre les Nemours, France

[21] Appl. No.: 08/722,150

[22] PCT Filed: Feb. 16, 1996

[86] PCT No.: PCT/FR96/00255

§ 371 Date: Feb. 25, 1997

§ 102(e) Date: Feb. 25, 1997

[87] PCT Pub. No.: WO96/26464

PCT Pub. Date: Aug. 29, 1996

[30] Foreign Application Priority Data

Feb. 21, 1995 [FR] France ................................. 95 01963

[51] Int. Cl.$^7$ .................................................. C30B 29/16
[52] U.S. Cl. ................................. 117/13; 117/81; 117/944
[58] Field of Search ................................. 117/13, 81, 944

[56] References Cited

U.S. PATENT DOCUMENTS

| | | | |
|---|---|---|---|
| 5,027,361 | 6/1991 | Kozlovsky et al. | 372/22 |
| 5,243,615 | 9/1993 | Ortiz et al. | 372/34 |
| 5,592,325 | 1/1997 | Dodge et al. | 359/326 |
| 5,703,713 | 12/1997 | Leong et al. | 359/352 |

OTHER PUBLICATIONS

Aka et al., "A new nonlinear and neodymium laser self–frequnecy doubling crystal with congruent melting Ca4gdO(BO)3", European Journal of Solid State Inorganic chemistry, vol. 33 (80, p. 727–736, 1996.

A. B. Ilyukhin, et al., Russian Journal of Inorganic Chemistry, vol. 38, No. 6, pp. 847 to 850, "Crystal Structures of Binary Oxoborates $LnCa_4O(BO_3)_3$ (Ln = Gd, Tb, Lu) and $Eu_2CaO(BO_3)_2$", 1993.

G. J. Dirksen, et al., Journal of Alloys and Compounds, vol. 191, pp. 121 to 126, "Tetracalcium Gadolinium Oxoborate ($Ca_4GdO(BO_3)_3$) As A New Host Lattice For Luminescent Materials", 1993.

R. Norrestam, et al., Chemical Mater, pp. 737–743, "Structural Investigations of New Calcium–Rare Earth (R) Oxyborates With the Composition $Ca_4RO(BO_3)_3$", 1992.

T. N. Khamaganova, et al., Russian Journal of Inorganic Chemistry, vol. 36, No. 4, pp. 484 to 485, The Crystal Structure of Calcium Samarium Oxide Borate $Ca_8Sm_2O_2(BO_3)_6$, 1991.

*Primary Examiner*—Robert Kunemund
*Attorney, Agent, or Firm*—Oblon, Spivak, McClelland, Maier & Neustadt, P.C.

[57] ABSTRACT

Non-linear single crystal obtained by crystallization of a congruent molten composition of general formula:

$$M_4LnO(BO_3)_3$$

in which:

M is Ca, or Ca partially substituted with Sr or Ba;

Ln is one of the lanthanides of the group comprising Y, Gd, La and Lu.

14 Claims, No Drawings

NON-LINEAR CRYSTALS AND THEIR APPLICATIONS

BACKGROUND OF THE INVENTION

1. Field of the Invention

The invention relates to crystals for non-linear optics, to the fabrication of these crystals and to the applications of these crystals.

2. Discussion of the Background

The crystals used in non-linear optics belong to various families, each exhibiting quite specific properties. Historically, one of the first products which appeared in this field was potassium dihydrogen phosphate (KDP). This material is still very widely used because of the relative ease of fabrication, and consequently its relatively low cost. On the other hand, KDP is very sensitive to water, which means that there are several constraints on the way in which it is used. Its second harmonic coefficient is small, which results in relatively low emission of frequency-doubled radiation. Although KDP may easily form good-sized single crystals, which may be required when it is necessary to be able to handle relatively high powers, most crystals for non-linear optics are of small size in practice. This is because they are usually produced by flux-determined growth. This is the case for BBO, LBO and KTP. In this mode, growth is very slow, requiring several weeks or even several months to reach sizes suitable for most uses.

It has been proposed to form crystals by congruent melting, using the Czochralski or Bridgman-Stockbarger techniques. This is the case, for example, for $LiNbO_3$ crystals. $LiNbO_3$ crystals exhibit the property of being photorefractive which, for secondharmonic generation, is a drawback. Finally, $LiNbO_3$ crystals are very brittle. $LaBGeO_5$ may also be formed by melting. However, it is difficult to obtain because of the appearance of undesirable phases, unless the crystallization operation is perfectly controlled. Moreover, this crystal provides only a relatively low non-linear susceptibility coefficient.

SUMMARY OF THE INVENTION

The invention therefore proposes the production of crystals for non-linear optics from their molten constituents, their melting being congruent. The invention also proposes the use of these non-linear crystals, in particular as frequency doublers or mixers or as optical parametric oscillators. The invention further proposes the use of these crystals incorporating an effective quantity of an ion for generating a laser effect for the purpose of producing self-frequency-doubling laser crystals.

According to the invention, the materials employed satisfy the general formula:

$$M_4LnO\,(BO_3)_3$$

in which:

M is Ca, or Ca partially substituted with Sr or Ba;

Ln is one of the lanthanides of the group comprising Y, Gd, La and Lu.

DETAILED DESCRIPTION OF THE PREFERRED EMBODIMENTS

In the case of Ca partially substituted with Sr or Ba, this substitution is limited to the content for which parasitic phases may develop in the molten bath during crystallization, in other words limited to values for which the $M_4LnO(BO_3)_3$ phase no longer exhibits congruent melting.

For compounds of the type:

$$Ca_{4-x}Sr_xLnO\,(BO_3)_3$$

x is preferably less than 0.5 and, even better, less than 0.30.

For compounds of the type:

$$Ca_{4-y}Ba_yLnO\,(BO_3)_3$$

y is preferably less than 0.5 and, even better, less than 0.3.

The choice of lanthanide may advantageously be determined depending on the projected use. This is because the non-linear coefficients and the birefringence of the material depend on the rare earth inserted into the matrix.

The crystals according to the invention may, as indicated previously, be doped by means of optically active lanthanide ions, such as $Nd^{3+}$. The crystals in question are of formula:

$$M_4Ln_{1-z}Nd_zO\,(BO_3)_3$$

in which:

M and Ln have the meanings indicated above, z depends on the desired effect, knowing that the presence of substituent elements may lead to competition between the effects induced. The consequence of increasing the concentration is firstly to increase the laser effect. Above a certain concentration of substitution ions, progressive extinction of the emission is observed. The substituted ions become too "close" to one another and interact. In practice, substitution does not exceed 20%, and preferably not 10%. In other words, z is preferably less than 0.2 and advantageously less than 0.1. In general, the concentration is such that the lifetime is not shorter than half the maximum lifetime observable at low concentration, i.e. 99 microseconds.

The non-linear crystals used according to the invention are advantageously obtained using a method of the Czochralski or Bridgman type. Any other crystal-growing method using melting may be suitable, in particular zone melting, which enables small-diameter single-crystal fibres to be obtained.

The molten baths are obtained from oxides of lanthanides, $Ln_2O_3$, suitable alkaline-earth metal carbonates $MCO_3$ and boric acid or anhydride. The constituents, in powder form, are intimately mixed and heated to a temperature sufficient to ensure melting of the mixture. This temperature is maintained until the mixture is completely homogeneous. The molten bath is then brought down to the crystallization temperature, which makes it possible to initiate the formation of a single crystal.

The method of forming Nd-doped cristals is identical. The mixture of oxides of lanthanides is simply substituted for the lanthanide alone.

The invention will be described in more detail below, especially with reference to $Ca_4GdO(BO_3)_3$ crystals.

The initial mixture is produced by means of 107 g of $Gd_2O_3$, 236 g of $CaCO_3$ and 109 g of $H_3BO_3$, constituting an approximately 300 g charge of oxides. The mixture made is placed in an approximately 100 cm³ iridium crucible in an inert atmosphere or in an approximately 100 cm³ platinum crucible in oxygen. The temperature is raised to 1550° C. and held there for 2 hours. It is then brought down to approximately the congruent melting temperature (1480° C.). A seed of suitably chosen crystallographic orientation is fixed on a rod which can rotate about its axis. The seed is brought into contact with the surface of the bath.

The rod rotates about its axis at between 33 and 45 rpm.

After a crystallization initiation period, the rod, still rotating, is moved translationally at about 0.5 mm/h for the first three hours, and then at 2.5 mm/h.

The uniform growth of the single crystal is interrupted when the cylinder formed is 8 cm in length, for a diameter of 2 cm. It is brought down to room temperature in 72 hours.

The single crystal formed exhibits very good homogeneity, with no inclusion of bubbles. It has a hardness of 6.5 Mohs.

The other crystals according to the invention are prepared according to the same techniques. The observed congruent melting points lie within the 1400 to 1500° C. temperature range.

The crystals obtained are mechanically strong and chemically resistant. They exhibit the property of being non-hygroscopic. In addition, they lend themselves suitably to subsequent cutting and polishing operations. Their structure is monoclinical with no centre of symmetry (Cm space group).

The crystallographic characteristics of $Ca_4GdΩ(BO_3)_3$ are:

a=8.092 Å b=16.007 Å c=3.561 Å

β=101.2°

Z=4 density d=3.75.

The orientations of the crystallophysical axes X, Y, Z with respect to the crystallographic axes a, b, c are:

(Z, a)=26°

(Y, b)=0°

(X, c)=15°.

The angle (V, z) between the optical axis and the Z axis is such that 2 (V, z)=120.66°, which defines the crystal as being a negative biaxial crystal.

The gadolinium crystal is transparent in the 0.35–3 micrometre range. For the yttrium compound, the transparency window is 0.22–3 micrometres.

The refractive indices as a function of wavelength are determined using the minimum deviation method. They are established in the given way in the following table for the $Ca_4GdO(BO_3)_3$ crystal:

| λ (μm) | $n_x$ | $n_y$ | $n_z$ |
| --- | --- | --- | --- |
| 0.4047 | 1.7209 | 1.7476 | 1.7563 |
| 0.4358 | 1.7142 | 1.7409 | 1.7493 |
| 0.4678 | 1.7089 | 1.7350 | 1.7436 |
| 0.4800 | 1.7068 | 1.7333 | 1.7418 |
| 0.5090 | 1.7033 | 1.7295 | 1.7379 |
| 0.5461 | 1.6992 | 1.7253 | 1.7340 |
| 0.5780 | 1.6966 | 1.7225 | 1.7310 |
| 0.5876 | 1.6960 | 1.7218 | 1.7303 |
| 0.6439 | 1.6923 | 1.7181 | 1.7265 |
| 0.6678 | 1.6910 | 1.7168 | 1.7250 |
| 0.7290 | 1.6879 | 1.7133 | 1.7216 |
| 0.7960 | 1.6860 | 1.7112 | 1.7197 |

From the experimental values above, the Sellmeier formulae have been established:

$n^2_z = 2.9222 + 0.02471/(\lambda^2 - 0.01279) - 0.00820\, \lambda^2$ $n^2_y = 2.8957 + 0.02402/(\lambda^2 - 0.01395) - 0.01039\, \lambda^2$ $n^2_x = 2.8065 + 0.02347/(\lambda^2 - 0.01300) - 0.00356\, \lambda^2$ By way of example, the phase matching for frequency doubling may be obtained for incident wavelengths lying between 0.87 μm and 3 μm. It is only of type I (at the fundamental frequency, the two photons have the same polarization) for the 1.064 μm wavelength of an Nd-doped YAG laser; it is either of type I or of type II (at the fundamental frequency, the two photons have orthogonal polarizations) for wavelengths lying between 1.064 and 3 μm.

For the borate studied, the type-I phase matching angles at 1.064 μm are:

θ Ø

(x, y) plane 90° 46.3°

(x, z) plane 19.3° 0°

The non-linear coefficients have been determined using the so-called "phase matching angle" method, by comparison with a standard crystal in the principal planes. The ZX plane has given the best performance. Thus:

$d_{12}=0.56$ pm/V $d_{32}=0.44$ pm/V.

The value of the effective non-linear coefficient $d_{eff}$ measured in the ZX plane, within the 788–1456 nm fundamental wavelength range, represents 40 to 70% of that of the $d_{eff}$ of BBO.

When exposed to the light flux of a 1.064 μm YAG laser (6 ns), the $Ca_4GdO(BO_3)_3$ crystal exhibits a damage threshold close to 1 $GW/cm^2$, comparable to that of BBO under the same conditions.

The angular acceptance of $Ca_4GdO(BO_3)_3$ is 2.15 mrd.cm, much higher than that of BBO (1.4 mrd).

The walk-off angle of $Ca_4GdO(BO_3)_3$ is 0.7° (i.e. 13 mrd), that is one fifth of that of BBO (4°, i.e. 70 mrd).

The conversion rate from the first to the second harmonic reaches a value of 55%. The crystals produce a stable response.

In view of the characteristics of $Ca_4GdO(BO_3)_3$ described above, the $Ca_4GdO(BO_3)_3$ crystals represent a novel material endowed with excellent non-linear properties.

From the estimated effective non-linear coefficient ($d_{eff}$), which is between 0.4 and 0.7 times that of BBO, the effectiveness of the non-linear process in $Ca_4GdO(BO_3)_3$ should be exceptional insofar as it is possible to produce from it large-sized single crystals using the Czochralski method.

Production of single crystals in a relatively rapid manner and for a moderate cost, combined with the previously mentioned characteristics, allows them to be suitably used in various applications. Among these applications, the most usual relate to the frequency doubling of laser beams, especially those emitting in the infrared, giving rise to radiation in the visible.

These crystals may also serve to obtain the sum or difference of frequencies between two laser beams and to constitute optical parametric oscillators.

Still by way of example of application, the crystals studied above have formed the subject of Nd-doping. In particular, the inventors have studied the properties of an Nd-doped $Ca_4GdO(BO_3)_3$ single crystal. The crystals prepared as above were substituted for 5% of the Gd with Nd.

The doped crystal offers the advantage of a very low absorption for wavelengths corresponding to the second harmonic, contrary to that which is observed, for example, for crystals developed hitherto for forming doubling lasers, such as Nd-doped $YAl_3(BO_3)_4$ (NYAB) crystals which exhibit a significant absorption at 531 nm.

The absorption spectrum exhibits a wide band centred on 810 nm, the effective cross-section of which is measured at $1.5 \times 10^{-20}$ cm$^2$.

The emission from the doped crystal for the $^4F_{3/2} \rightarrow ^4I_{11/2}$ transition is at the 1060 nm wavelength, with an effective emission cross-section of $1.7 \times 10^{-20}$ cm$^2$.

For a 5% Nd doping level, the lifetime of the excited state is 95 microseconds.

The laser tests carried out on a $Ca_4GdO(BO_3)_3$ crystal doped with neodymium and cut along the crystallophysical axes X, Y and Z have led to the observation of the laser effect at 1060 nm, with the following characteristics:

| Direction of propagation of the pump beam | Threshold power (mW) | Differential yield (%) | Polarization of the emitted laser beam |
| --- | --- | --- | --- |
| X | 288 | 29 | E//Z |
| Y | 125 | 34 | E//X |
| Z | 210 | 29 | E//X |

The frequency doubling produces radiation at 530 nm, therefore outside the intense absorption zones of the crystal. For this reason, the self-frequency-doubling lasers according to the invention make it possible to obtain very high intensity of this second harmonic.

The examples indicated above are not limiting in character. They are given by way of illustration of the invention in some of its embodiments. They are sufficient to show the advantages provided by the invention of crystals which are relatively inexpensive, of large size and providing useful properties as frequency doublers or mixers, optical parametric oscillators or as self-doubling lasers.

What is claimed is:

1. Non-linear single crystal obtained by crystallization of a congruent molten composition of general formula:

$$M_4LnO(BO_3)_3$$

in which:

M is Ca, or Ca partially substituted with Sr or Ba;

Ln is one of the lanthanides of the group comprising Y, Gd, La and Lu wherein, in the general formula of which, when Ca is partially substituted with Sr or Ba, the content of the substituted element is limited to that for which the melting is no longer congruent.

2. Non-linear single crystal obtained by crystallization of a congruent molten composition, of general formula:

$$Ca_{4-x}Sr_xLnO(BO_3)_3$$

in which x is less than 0.5.

3. Non-linear single crystal obtained by crystallization of a congruent molten composition, of general formula:

$$Ca_{4-y}Ba_yLnO(BO_3)_3$$

in which y is less than 0.5.

4. Non-linear single crystal obtained by crystallization of a congruent molten composition of general formula:

$$M_4LnO(BO_3)_3$$

in which:

M is Ca, or Ca partially substituted with Sr or Ba;

Ln is one of the lanthanides of the group comprising Y, Gd, La and Lu, the said crystal being doped and satisfying the general formula:

$$M_4Ln_{1-z}Nd_zO(BO_3)_3$$

in which:

M and Ln have the meanings indicated above;

z is at most equal to 0.2.

5. In a self-frequency-doubling laser containing a crystal, the improvement wherein the crystal is the single crystal according to claim 4 and contains Nd, wherein M is Ca, and Ln is Gd or La.

6. A method of preparing a non-linear single crystal comprising:

(a) providing a bath of a congruent molten composition of the formula $$M_4LnO(BO_3)_3$$

from oxides of Ln, carbonates of M, and boric acid, as raw materials, by melting the raw materials in a high temperature resistant material at a higher temperature than the congruent melting temperature of the crystal, wherein M is Ca, or Ca partially substituted with Sr or Ba;

Ln is one of the lanthanides selected from the group consisting of Y, Gd, La, and Lu;

(b) bringing the melt down to approximately the congruent melting temperature of the crystal;

(c) adding a seed with a suitably chosen crystallographic orientation;

(d) fixing the seed on a rotating rod;

(e) bringing the seed into contact with a surface of the bath;

(f) moving the rod translationally and forming the single crystal.

7. Non-linear single crystal obtained by crystallization of a congruent molten composition of general formula:

$$M_4LnO(BO_3)_3$$

in which

M is Ca, or Ca partially substituted with Sr or Ba;

Ln is one or a mixture of metals selected from the group consisting of Y, La, Gd, Nd and Lu.

8. A method of preparing a non-linear single crystal comprising:

(a) providing a bath of a congruent molten composition of the formula $$M_4LnO(BO_3)_3$$

from oxides of Ln, carbonates of M, and boric acid, as raw materials, by melting the raw materials in a high temperature resistant material at a higher temperature than the congruent melting temperature of the crystal, wherein M is Ca, or Ca partially substituted with Sr or Ba;

Ln is one or a mixture of metals selected from the group consisting of Y, La, Gd, Nd and Lu;

(b) bringing the melt down to approximately the congruent melting temperature of the crystal;

(c) adding a seed with a suitably chosen crystallographic orientation;

(d) fixing the seed on a rotating rod;

(e) bringing the seed into contact with a surface of the bath;

(f) moving the rod translationally and forming the single crystal;

(g) bringing the single crystal down to room temperature.

9. Non-linear single crystal obtained by the method of claim 6.

10. Non-linear single crystal obtained by the method of claim 8.

11. The non-linear single crystal of claim 7, and having a length of at least 8 cm, or a diameter of at least 2 cm, or both.

12. In a frequency doubler containing a crystal, the improvement wherein the crystal is the single crystal according to claim 7.

13. In an optical parametric oscillator containing a crystal, the improvement wherein the crystal is the single crystal according to claim 7.

14. In a frequency mixer for two lasers containing a crystal, the improvement wherein the crystal is the single crystal according to claim 7.

* * * * *

UNITED STATES PATENT AND TRADEMARK OFFICE
CERTIFICATE OF CORRECTION

PATENT NO. : 6,083,319

DATED : July 4, 2000

INVENTOR(S) : Gerard AKA, et al.

It is certified that error appears in the above-identified patent and that said Letters Patent is hereby corrected as shown below:

Column 3, line 17, "$Ca_4Gd\Omega(BO_3)_3$" should read --$Ca_4GdO(BO_3)_3$--.

Column 6 line 47, insert new line after "crystal." --(g) bringing the single crystal down to room temperature.--

Signed and Sealed this

Eighth Day of May, 2001

Attest:

NICHOLAS P. GODICI

Attesting Officer

Acting Director of the United States Patent and Trademark Office